(12) United States Patent
Benzel et al.

(10) Patent No.: US 7,479,234 B2
(45) Date of Patent: Jan. 20, 2009

(54) METHOD FOR PRODUCING CAVITIES HAVING OPTICALLY TRANSPARENT WALL

(75) Inventors: Hubert Benzel, Pliezhausen (DE); Heribert Weber, Nuertingen (DE); Frank Schaefer, Tuebingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/492,009

(22) PCT Filed: Sep. 4, 2002

(86) PCT No.: PCT/DE02/03261

§ 371 (c)(1), (2), (4) Date: Sep. 1, 2004

(87) PCT Pub. No.: WO03/031318

PCT Pub. Date: Apr. 17, 2003

(65) Prior Publication Data

US 2005/0016949 A1    Jan. 27, 2005

(30) Foreign Application Priority Data

Oct. 5, 2001    (DE) ................................. 101 49 139

(51) Int. Cl.
*H01B 13/00*    (2006.01)
(52) U.S. Cl. .................. 216/42; 216/46; 216/51; 216/55; 216/62
(58) Field of Classification Search .................. None
See application file for complete search history.

(56) References Cited

U.S. PATENT DOCUMENTS 3,919,060 A * 11/1975 Pogge et al. ................. 438/355
4,203,128 A * 5/1980 Guckel et al. ............... 331/156
4,478,077 A * 10/1984 Bohrer et al. ............. 73/204.26
4,890,370 A * 1/1990 Fukuda et al. .................. 216/2
4,943,032 A * 7/1990 Zdeblick ....................... 251/11
5,582,701 A * 12/1996 Geis et al. ................... 204/451
5,583,058 A * 12/1996 Utsumi et al. ............ 250/338.4
5,839,467 A * 11/1998 Saaski et al. ................ 137/501

(Continued)

FOREIGN PATENT DOCUMENTS

EP    0 747 686    12/1996

(Continued)

OTHER PUBLICATIONS

Turner, et al., *Monolithic Nanofluid Sieving Structures for DNA Manipulation*, J. Vacuum Sci. Technol. B, Nov./Dec. 1998, pp. 3835-3840.

(Continued)

*Primary Examiner*—Allan Olsen
(74) *Attorney, Agent, or Firm*—Kenyon & Kenyon LLP

(57) ABSTRACT

A method is proposed which will enable cavities having optically transparent walls to be produced simply and cost-effectively in a component by using standard methods of microsystems technology. For this purpose, a silicon region is first produced, which is surrounded on all sides by at least one optically transparent cladding layer. At least one opening is then produced in the cladding layer. Over this opening, the silicon surrounded by the cladding layer is dissolved out, forming a cavity within the cladding layer. In this context, the cladding layer acts as an etch barrier layer.

2 Claims, 5 Drawing Sheets

U.S. PATENT DOCUMENTS

| | | | |
|---|---|---|---|
| 5,991,487 A * | 11/1999 | Sugiyama | 385/129 |
| 6,124,145 A * | 9/2000 | Stemme et al. | 438/26 |
| 6,136,212 A | 10/2000 | Man et al. | |
| 6,149,123 A * | 11/2000 | Harris et al. | 251/11 |
| 6,197,610 B1 | 3/2001 | Toda | |
| 6,548,322 B1 * | 4/2003 | Stemme et al. | 438/57 |
| 6,561,625 B2 * | 5/2003 | Maeng et al. | 347/47 |
| 6,642,151 B2 * | 11/2003 | Khan et al. | 438/714 |
| 6,677,214 B1 * | 1/2004 | Shindo et al. | 438/365 |
| 6,807,353 B1 * | 10/2004 | Fleming et al. | 385/132 |
| 2003/0015770 A1 * | 1/2003 | Talin et al. | 257/622 |
| 2003/0035613 A1 * | 2/2003 | Huber et al. | 385/16 |
| 2004/0175844 A1 * | 9/2004 | Yang et al. | 438/2 |
| 2004/0262636 A1 * | 12/2004 | Yang et al. | 257/200 |
| 2005/0193827 A1 * | 9/2005 | Fischer et al. | 73/754 |

FOREIGN PATENT DOCUMENTS

WO      01 30715      5/2001

OTHER PUBLICATIONS

Tjerkstra et al., *Multi-Walled Microchannels: Free-Standing Porous Silicon Membranes For Use In TAS*, J. of Microelectromech. Systems, vol. 9, No. 4, Dec. 2000, pp. 495-501.

Bjorkman et al., *Diamond Microchips for Fast Chromatography of Proteins*, Sensors and Actuators, Switzerland, vol. 79, No. 1, Sep. 25, 2001, pp. 71-77.

Youngmin et al., *Micromachined Fabry-Perot Cavity Pressure Transducer With Optical Fiber Interconnects*, Micromachined Devices and Components, Austin, TX, Oct. 23-4, 1995, pp. 242-249.

* cited by examiner

Fig. 6a
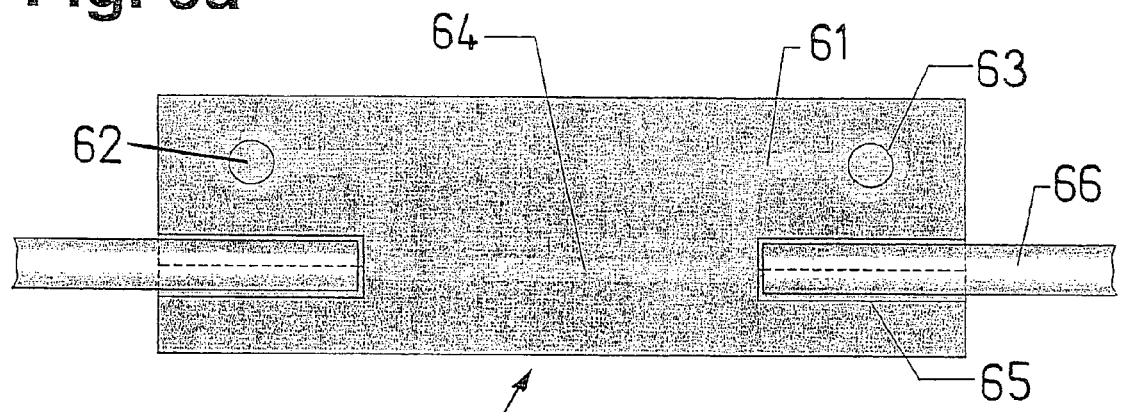
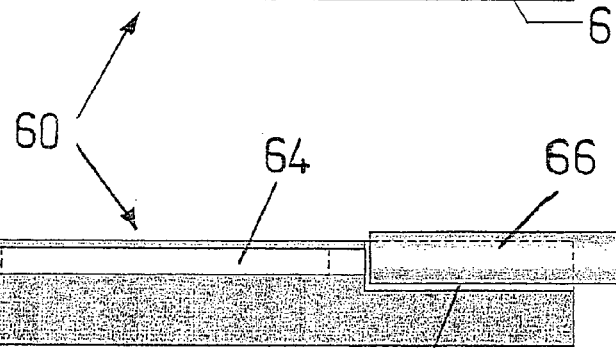
Fig. 6b

METHOD FOR PRODUCING CAVITIES HAVING OPTICALLY TRANSPARENT WALL

FIELD OF THE INVENTION

The present invention is directed to a method for producing cavities having optically transparent walls in a component using Microsystems technology.

BACKGROUND INFORMATION

Components having such cavities are used, for example, in optical examinations of gases or liquids. Chemical reactions initiated by the action of light, for example a laser beam, can also be carried out in cavities having optically transparent walls. Components having optically transparent channels are also used for optical level checking.

To fabricate components which have cavities and, in particular, channels having optically transparent walls, it is standard practice to bond one or more glass wafers to the substrate of the component. On the whole, this method is very costly. If the component is intended to be used in optical investigations of liquids or gases, glass fibers are often integrated in the component to enable light to be coupled into the cavity. In this case, it turns out to be even more costly and complex to fabricate the component using the method known from standard practice.

SUMMARY OF THE INVENTION

The present invention proposes a method which will enable cavities having optically transparent walls to be produced simply and cost-effectively in a component by using standard methods of Microsystems technology. In this context, the method of the present invention also enables other functional elements to be integrated in the component.

This is achieved in accordance with the present invention in that a silicon region is produced, which is surrounded on all sides by at least one optically transparent cladding layer, in that at least one opening is produced in the cladding layer, and in that the silicon surrounded by the cladding layer is dissolved out from above the opening in the cladding layer, the cladding layer acting as an etch barrier layer.

The present invention has recognized that it is very simple to produce cavities having optically transparent walls by using Microsystems technology, when the walls act at the same time as an etch barrier layer, i.e., when a substance whose etching rate is high in relation to the silicon is used to dissolve out the silicon and which, at the same time, has a high etching selectivity with respect to the material of the cladding layer. Essential to the method of the present invention are, therefore, not only producing a silicon region which is surrounded on all sides by an optically transparent cladding layer, but also a suitable combination of cladding layer material and etching means. To dissolve out the silicon, the cladding layer may be advantageously opened at locations where access openings are provided for the cavity or channel—due to the component's function. Besides making it possible for a cavity having a transparent wall to be produced, the techniques used within the framework of the method of the present invention also enable other functional elements to be implemented, such as light-emitting regions having porous silicon, photodiodes, micromechanical elements, such as pumps and valves, a corresponding control or evaluation circuit, etc.

As already mentioned, the cladding layer may be made of different materials, as long as it is optically transparent and acts as an etch barrier layer when the surrounding silicon is dissolved out. Particularly well suited as materials for the cladding layer are silicon oxide and silicon nitride, since they fulfill these two criteria with respect to the etching means most commonly used for etching silicon and, moreover, form an electrical insulation from the substrate of the component. The cladding layer may also be formed, however, completely or partially from boron-phosphorus silicate glass. From all the afore-mentioned materials, layers of adequate thickness are able to be simply produced, which may be structured using methods customary in Microsystems technology, thereby enabling openings to also be simply produced in the cladding layer.

The silicon surrounded by the cladding layer may be dissolved out using wet-chemical etching or also vapor-phase etching. In the vapor phase, xenon difluoride $XeF_2$ is advantageously used for the etching process, since it makes possible very high etching rates and substantial undercut etching of the cladding layer.

BRIEF DESCRIPTION OF THE DRAWINGS

FIGS. 6a and 6b are a plan view of and a section through a component having a channel produced in accordance with the present invention, onto which glass fibers are coupled.

DETAILED DESCRIPTION

As just mentioned, FIGS. 1a through 1e show a component 10 in the individual phases of a variant of the method of the present invention for producing a cavity having an optically transparent wall. Here, component 10 is implemented on a silicon substrate 1. In the exemplary embodiment shown here, however, component 10 may also be implemented on another substrate that is suited for use in Microsystems technology.

Figure 1A:
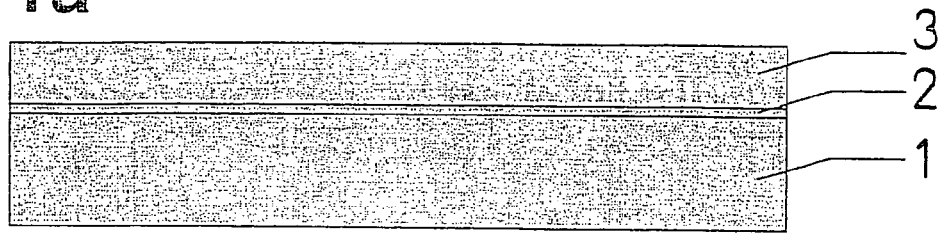
FIGS. 1a through 1e show a component in the individual phases of a first variant of the method of the present invention for producing a channel having an optically transparent wall.

The layer construction shown in FIG. 1a corresponds to that of an SOI wafer, but may also be implemented by starting out from a silicon wafer that forms substrate 1. To this end, a silicon oxide layer 2 is produced on substrate 1. This may be accomplished by oxidation of silicon wafer 1 or also by deposition of silicon oxide onto the surface of silicon wafer 1. The silicon oxide layer is optically transparent. A polycrystalline silicon-epitaxy layer 3 is subsequently deposited onto silicon oxide layer 2.

Figure 1B:
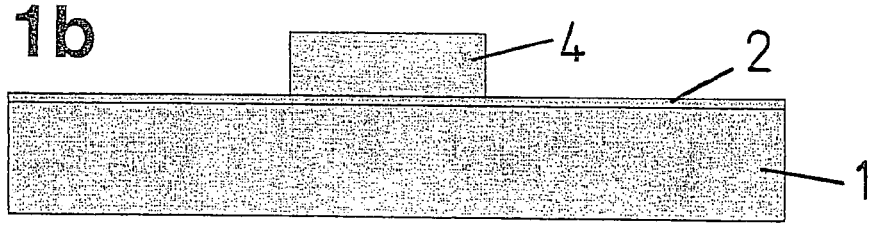

At this point, silicon-epitaxy layer 3 is structured in such a way that a silicon region 4 is formed which has the geometry of the cavity to be produced. For that purpose, in one variant of the method of the present invention, epitaxy layer 3 is completely removed again right down to silicon region 4. This state is illustrated in FIG. 1b. To structure epitaxy layer 3, standard etching techniques, such as anisotropic plasma etching, in particular, are employed, silicon oxide layer 2 being used as an etch barrier layer.

Figure 1C:
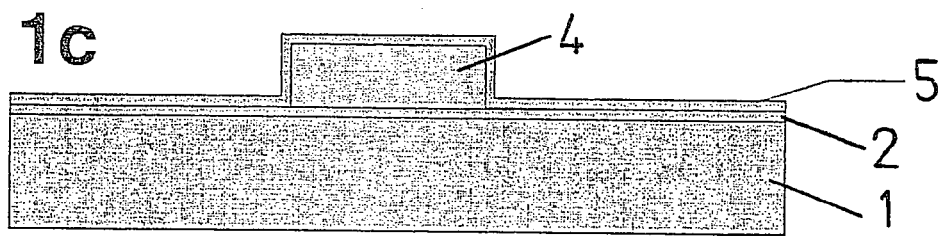

The structure shown in FIG. 1b is oxidized to a higher valency, or a silicon oxide layer is deposited, i.e., a continuous second silicon oxide layer 5 is produced on structured epitaxy layer 3, and, as the case may be, on the exposed regions of silicon oxide layer 2 and over silicon region 4, with the result that silicon region 4 is surrounded on all sides by silicon oxide layers 2 or 5, which form an optically transparent cladding layer for silicon region 4. This state is illustrated in FIG. 1c.

Figure 1D:
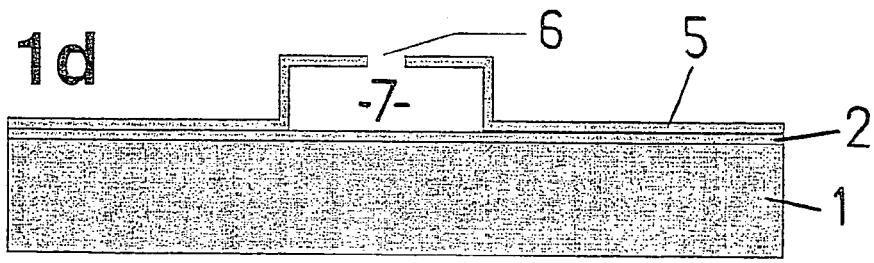
Figure 1E:
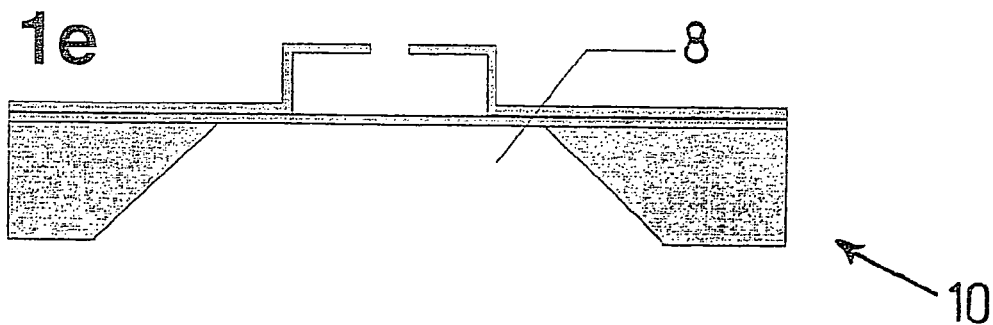

In the cladding layer, an opening 6 is subsequently produced, above which the silicon surrounded by the cladding layer is dissolved out, so that a cavity 7 surrounded by the optically transparent cladding layer is formed. The dissolving operation is preferably carried out in the vapor phase using xenon difluoride XeF2, since silicon oxide acts as an etch barrier to this etching agent, and since very high etching rates and substantial undercut etching are attainable using this etching agent. In FIG. 1d, component 10 is shown after silicon region 4 has been dissolved out from above opening 6 in the cladding layer.

For optical investigations of gases or liquids, the bottom side of cavity 7 is often exposed, for example. For this purpose, standard etching techniques may be used, such as KOH etching or anisotropic plasma etching. In this case as well, the cladding layer of cavity 7 is used as an etch barrier. In the variant shown in FIG. 1e, the bottom side of cavity 7 is exposed by KOH etching, in that, starting from the rear side of silicon wafer 1, a cavity 8 is produced in the region of cavity 7.

Figure 2A:
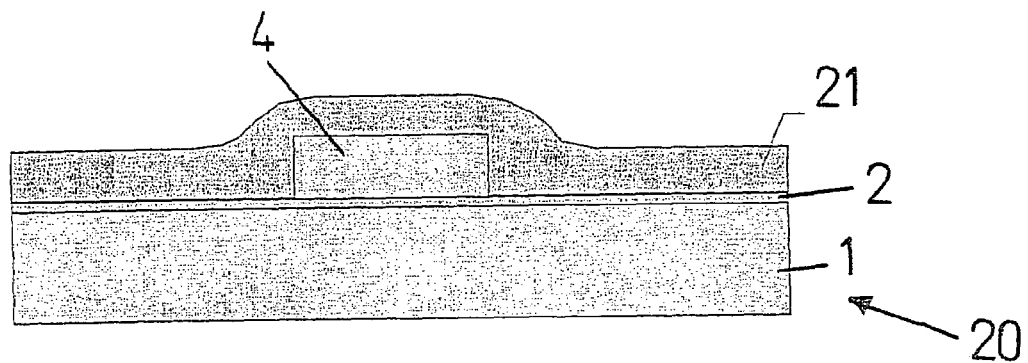
FIGS. 2a and 2b illustrate variants of the method sequence depicted in FIGS. 1a through 1d.
Figure 2B:
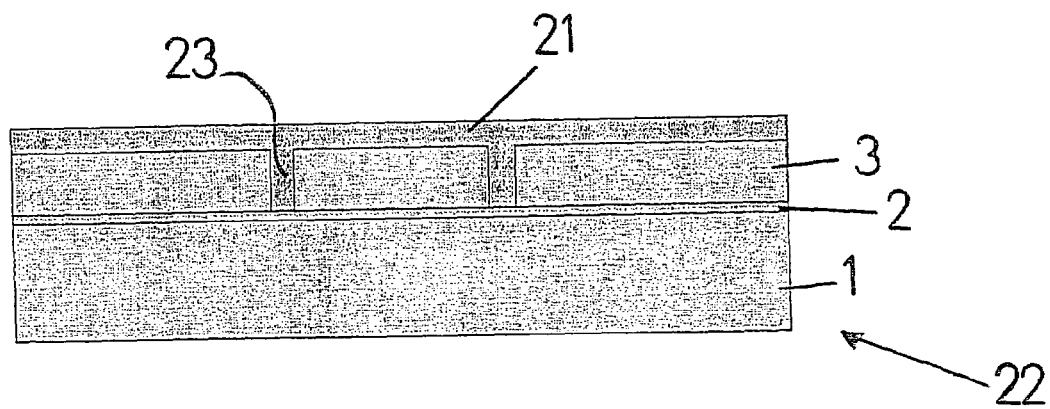

To produce opening 6 in the cladding layer, a lithographic step is typically used, in which the entire surface of the second optically transparent etch barrier layer is resist-coated. This resist-coating proves to be problematic when working with the topography shown in FIG. 1c. FIGS. 2a and 2b depict two variants of the situation shown in FIG. 1c—substrate 1 having a first silicon oxide layer 2, structured silicon epitaxy layer 3 and silicon region 4, respectively, and second optically transparent etch barrier over structured epitaxy layer 3-, where a subsequent resist-coating is not problematic because of the smoothed topography.

In the case of component 20 shown in FIG. 2a, as a second optically transparent layer 21, a thick silicon oxide or silicon nitride layer is deposited on structured epitaxy layer 3, which leads to a rounding of the edges. A planarizing step may also be additionally carried out here. In place of silicon oxide or silicon nitride, boron-phosphorus silicate glass (BPSG) may also be deposited, which likewise forms an optically transparent layer. When subjected to a subsequent annealing, the BPSG liquefies, which likewise leads to a smoothing of the topography.

In component 22 shown in FIG. 2b, merely trenches 23 are produced when structuring silicon epitaxy layer 3. They define silicon region 4, which has the geometry of the cavity to be produced. Thus, here, even outside of silicon region 4, epitaxy layer 3 is not completely removed. During the subsequent oxidizing of the thus generated structure to a higher valency, inter alia, a silicon oxide layer also grows on the side walls of trenches 23, causing them to close. As a result, on the whole, the topography of the surface is smoothed. The second optically transparent layer 21 may be alternatively produced by depositing silicon oxide, silicon nitride or BPSG, trenches 23 likewise being closed.

Figure 3A:
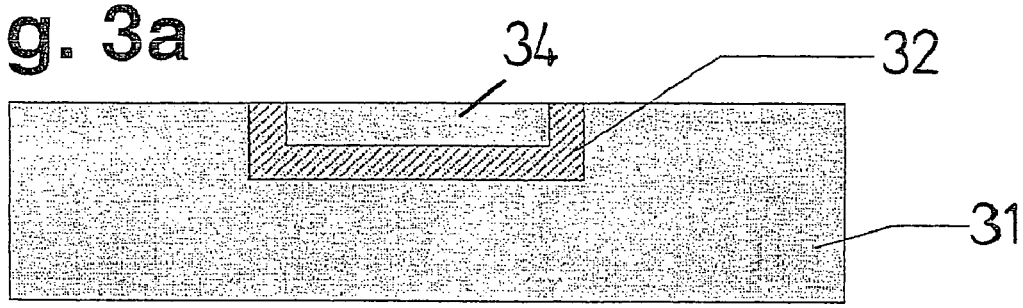
FIGS. 3a through 3d show a component in the individual phases of a second variant of the method of the present invention for producing a channel having an optically transparent wall.

FIGS. 3a through 3d show a component 30 in the individual phases of a another variant of the method of the present invention for producing a cavity having an optically transparent wall. Here, component 30 is also implemented on a silicon substrate 31. In substrate 31, using standard semiconductor techniques, such as doping and epitaxy, a buried, doped region 32 is produced, as is shown in FIG. 3a.

Figure 3B:
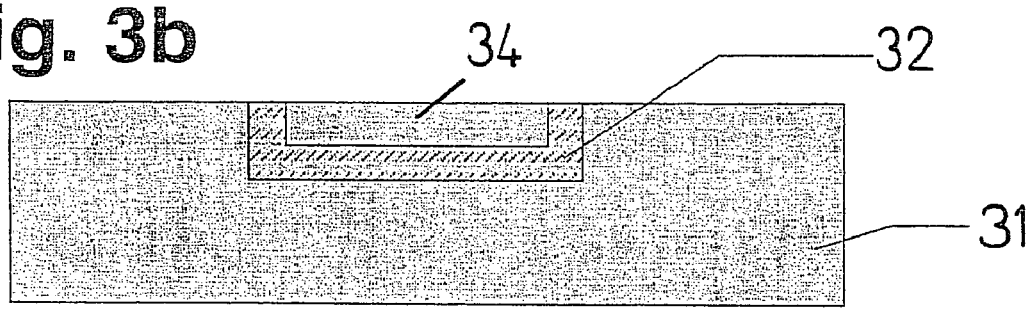

In a p-doped substrate, the doped region has a p+-doping, for example. Also possible is an n+-doping in an n-doped substrate. Decisive for the selection of the doping is that doped region 32, given a subsequent anodization, is etched to be porous clearly more rapidly than substrate 31 surrounding doped region 32. Thus, as a result of the anodization, a buried porous region 32 is produced in substrate 31, as is shown in FIG. 3b.

Figure 3C:
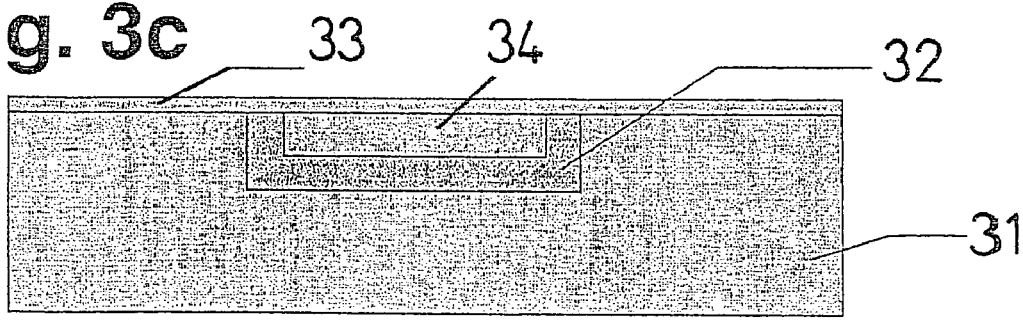

In a subsequent oxidation step, the porous silicon in region 32 is quickly oxidized due to its large surface area. In addition, a silicon oxide layer 33 forms on the surface of substrate 31, so that a silicon region 34 is formed which is surrounded on all sides by a silicon oxide layer as a cladding layer. To avoid material distortions, the porosity of the porous silicon must be selected in such a way that the pores are filled by the material growth during the oxidation. Both the silicon oxide in buried region 32, as well as silicon oxide layer 33 are optically transparent. FIG. 3c illustrates component 30, following the oxidation step.

Figure 3D:
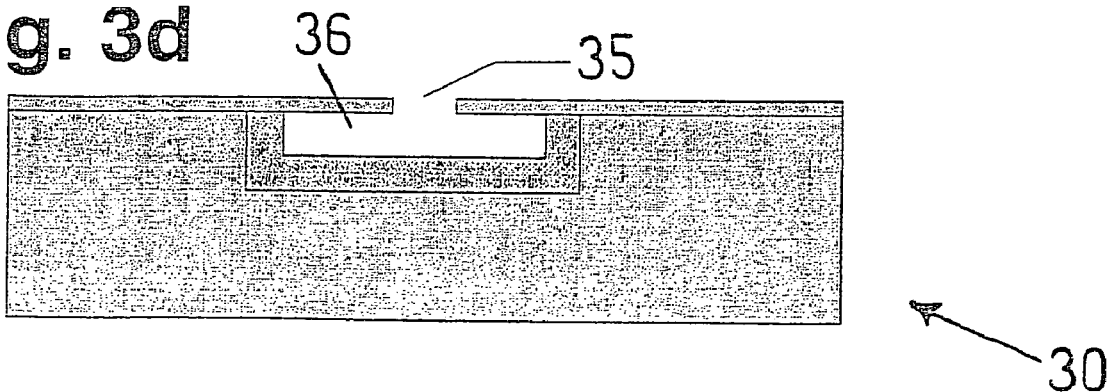

As in the method variant described in conjunction with FIGS. 1a through 1e, here as well, the cladding layer is opened in that an opening 35 is produced in silicon oxide region 33 in the area of silicon region 34. Above this opening 35, the silicon surrounded by the cladding layer is etched out. FIG. 3d shows finished component 30 including the thus formed cavity 36.

Figure 4:
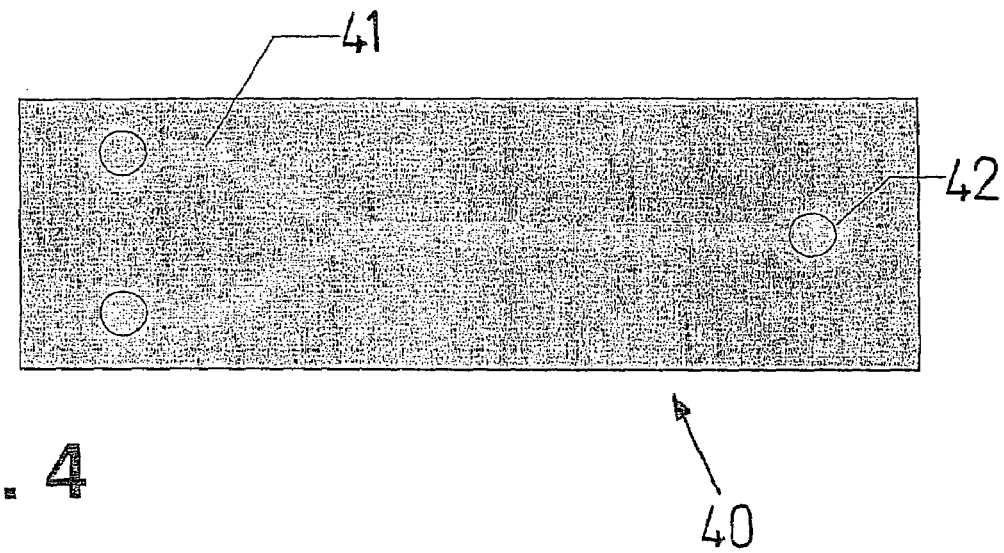
FIG. 4 is a plan view of a component having a channel structure that is produced in accordance with the present invention.

FIG. 4 illustrates a component 40 having a channel structure 41 produced in accordance with the present invention, which includes three access openings 42. The silicon is dissolved out of the channel region via access openings 42. Access openings 42 are configured in such a way that they are also usable as supply or discharge orifices when illustrated component 40 is used.

Within the scope of one advantageous embodiment of the method of the present invention for producing channels having optically transparent walls in a component, capacitor plates are implemented in the area of the channel wall, so that the channel is situated between the capacitor plates. To that end, the channel wall may be provided, for example, with a suitable doping or metallic coating. The capacitance of the capacitor is then dependent on which medium is situated in the channel. A system of this kind may be used, for example, as a fluid-level gauge. The implementation of a barrier, where only a comparatively small channel section is provided with capacitor plates, is based on the same principle. Here, the capacitance of the system changes when a medium attains the channel section provided with the capacitor plates.

Figure 5:
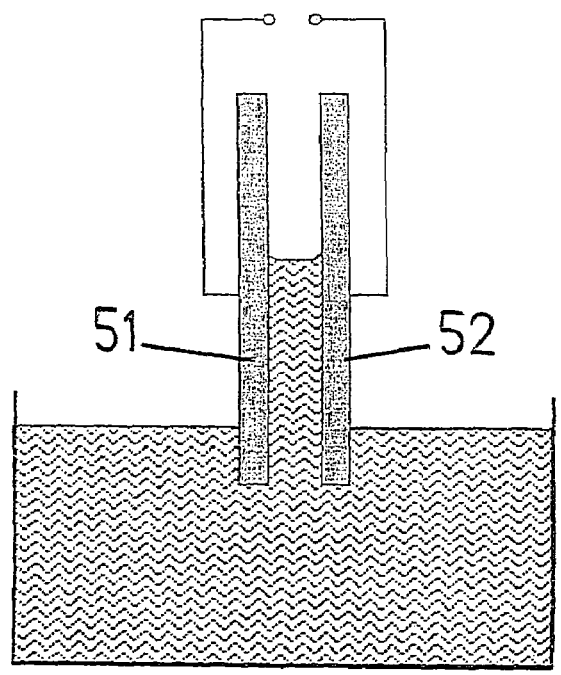
FIG. 5 schematically depicts one possible application of a component having a channel produced in accordance with the present invention, in whose wall, capacitor plates are integrated.

A channel provided with capacitor plates may also be used for drawing in dielectrics. Such a design is schematically shown in FIG. 5. The capacitor plates integrated in the channel wall are denoted by 51 and 52. In response to the application of a voltage, dielectrics, such as water, are suctioned up to a certain level between capacitor plates 51 and 52, since the energy density of the electric field between capacitor plates 51 and 52 is thereby increased. A system of this kind may be used, for example, as a metering device.

In the area of such a channel, a heating structure, for example of platinum, may be produced to heat the medium in the channel. A structure of this kind may also be used for measuring the temperature of the medium.

Another advantageous embodiment of the method of the present invention provides for using standard etching techniques to not only produce the cavity or channel, but also to produce recesses for glass fibers as well, in order to couple light into the cavity or channel. Thus, for example, by anisotropic etching using KOH, so-called V-grooves are able to be produced, which are able to be positioned and dimensioned very precisely. In these structures, glass fibers may be adjusted very precisely. This is not only important for optical investigations, such as transmission spectroscopy, but also, for example, for coupling in a laser beam, which is intended to initiate photochemical reactions. In FIGS. 6a and 6b, a component 60, which is especially suited for transmission investigations, is shown in a plan view (FIG. 6a) and in section (FIG. 6b). Channel 61 is routed in an essentially U-shape. A medium may be fed to channel 61 via a supply orifice 62 at the one end of channel 61 and then emerge again from channel 61 via a discharge orifice 63. The crosspiece of the U-shape of channel 61 forms an optical path 64. In an extension of optical path 64, V-grooves 65 are formed in component 60. Into each of these, a glass fiber 66 is placed for coupling light into optical path 64.

Finally, it is pointed out here that other functional elements, such as light-emitting regions having porous silicon, photodiodes, micromechanical pumps and valves, and also a suitable control and evaluation circuit, may be implemented in the available areas of a component that is designed using the method of the present invention.

In summary, the method of the present invention enables components to be produced, whose cavities and, in particular, channels have walls which are completely, or at least regionally, optically transparent. To that end, on a substrate, silicon regions are produced which are clad over the entire surface with a material which is optically transparent and acts as an etch barrier, such as silicon oxide, silicon nitride or BPSG. In this context, the silicon regions correspond to the form of the cavities to be produced. The cladding layer is open at the location of the access openings of the cavities. The silicon is dissolved out by wet-chemical or vapor-phase etching. In this connection, xenon difluoride $XeF_2$ is preferably used for the etching process. This gas etches silicon at a high etching rate and with a high etching selectivity with respect to silicon oxide and silicon nitride. In addition, this gas enables very large undercuts of up to several millimeters to be etched, so that it is very well suited for dissolving out the enclosed silicon, starting out from the access openings of a cavity and, in particular, of a channel.

What is claimed is:

1. A method for producing cavities having optically transparent walls in a component using microsystems technology, comprising:

producing a silicon region in a silicon substrate, wherein the component is implemented on the silicon substrate;

producing an optically transparent cladding layer that surrounds the silicon region on all sides, wherein the producing of the cladding layer includes:

producing a first buried, doped region in the silicon substrate, whereby the first buried, doped region includes vertical walls so that the silicon region is laterally and downwardly surrounded by the first buried, doped region;

performing an anodization in which a second buried, porous region is formed from the first buried, doped region;

performing an oxidation in which a porous silicon in one of the first buried, doped region and the second buried, porous region is oxidized to form a first portion of the cladding layer; and forming a silicon oxide layer as a second portion of the cladding layer on a surface of the silicon substrate so that the silicon region is surrounded on all sides by the cladding layer;

producing at least one opening in the cladding layer; and dissolving out in a vapor phase the silicon surrounded by the cladding layer from above the at least one opening in the cladding layer, wherein the dissolving out is performed using xenon difluoride $XeF_2$, the cladding layer acting as an etch barrier layer.

2. The method as recited in claim 1, wherein:

the cladding layer is also used as an etch barrier layer when exposing a wall from the outside of a cavity.

* * * * *